United States Patent
Doerrer (12)

(10) Patent No.: US 7,956,780 B2
(45) Date of Patent: *Jun. 7, 2011

(54) FILTER WITH CAPACITIVE FORWARD COUPLING

(75) Inventor: Lukas Doerrer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 122 days.

This patent is subject to a terminal disclaimer.

(21) Appl. No.: 12/358,251

(22) Filed: Jan. 23, 2009

(65) Prior Publication Data

US 2009/0128388 A1 May 21, 2009

Related U.S. Application Data

(63) Continuation of application No. 11/754,822, filed on May 29, 2007, now Pat. No. 7,532,137, and a continuation of application No. 12/206,647, filed on Sep. 8, 2008, now Pat. No. 7,796,071.

(51) Int. Cl.
*H03M 3/00* (2006.01)

(52) U.S. Cl. .................... 341/143; 375/240.03

(58) Field of Classification Search .......... 341/122–155, 341/200; 375/240.03, 224–260, 295–296, 375/345, 359, 342

See application file for complete search history.

(56) References Cited

U.S. PATENT DOCUMENTS

| | | | | |
|---|---|---|---|---|
| 5,973,631 A * | 10/1999 | McMullen et al. | ........... | 341/144 |
| 6,115,395 A | 9/2000 | Norrell et al. | | |
| 6,400,297 B1 * | 6/2002 | Tucker | ........... | 341/143 |
| 6,498,573 B2 | 12/2002 | Laaser | | |
| 7,049,990 B2 * | 5/2006 | Ranganathan | ........... | 341/143 |
| 7,119,608 B2 | 10/2006 | Doerrer | | |
| 7,262,726 B2 * | 8/2007 | Schreier et al. | ........... | 341/143 |
| 7,317,411 B1 | 1/2008 | Nanda et al. | | |
| 7,362,252 B1 * | 4/2008 | Pai | ........... | 341/143 |
| 7,365,663 B2 * | 4/2008 | Rylov et al. | ........... | 341/133 |
| 7,365,667 B1 | 4/2008 | Nanda et al. | | |
| 7,388,530 B2 * | 6/2008 | Pedersen et al. | ........... | 341/143 |
| 7,532,137 B2 * | 5/2009 | Doerrer | ........... | 341/143 |

OTHER PUBLICATIONS

Breems, et al., "A 1.8-mW CMOS Sigma-Delta Modulator with Integrated Mixer for A/D Conversion of IF Signals", IEEE Journal of Solid-State Circuits, vol. 35, No. 4, Apr. 2000, pp. 468-475.

Breems, et al., "Continuous time sigma delta modulation for A/D conversion in radio receivers", Kluwer Academic Press, 2001, pp. 59-64, 91.

Northworthy, et al., "Delta Sigma Data Converters", IEEE Press, 1997, pp. 174-181.

Paton, et al., "A 70-mW 300-MHz CMOS Continuous-Time Sigma Delta ADC With 15-MHz Bandwidth and 11 Bits of Resolution", IEEE Journal of Solid State Circuits, vol. 39 No. 7, Jul. 2004, pp. 1056-1063.

Philips, K., "Sigma Delta A/D Conversion for Signal Conditioning", Springer 2006, pp. 22-26.

Sandner, et al., "A 6bit, 1.2GSps Low-Power Flash-ADC in 0.13μm Digital CMOS", 2004 IEEE, pp. 339-342.

Schimper, et al., A 3mW Continuous-Time SigmaDelta-Modulator for EDGE/GSM with High Adjacent Channel Tolerance, 4 pages 2002 IEEE.

* cited by examiner

*Primary Examiner* — Lam T Mai

(74) *Attorney, Agent, or Firm* — SpryIP, LLC

(57) ABSTRACT

This disclosure relates to techniques and architecture for summing, sampling, and converting signals associated with a capacitive feedforward filter using a quantizer.

22 Claims, 9 Drawing Sheets

US 7,956,780 B2

FILTER WITH CAPACITIVE FORWARD COUPLING

BACKGROUND

Mobile Communication devices, such as mobile phones, rely on the wireless transmission of signals. Due to the nature of mobile devices and telecommunications generally, forward amplifying filter structures, also referred to as feedforward filters, are used for continuous time filtering of signals. It would be advantageous to have a capacitance feed forward design that capitalizes on the simplicity of the feed forward design, but that does not have the drawbacks of current capacitive feed forward devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

According to the techniques described below, a portion of the feedforward architecture for a filter is integrated with a quantizer associated with the filter. The filter may be, for example, a continuous time filter or a switched capacitor filter and has feedforward branches that connect to passive devices, such as capacitive elements, that are incorporated or integrated with the quantizer. This integration of the feed forward capacitive elements allows the summation of the feedforward branches to be performed at the same time as the sampling phase of the quantizer. The resulting signal from the sampling phase may be converted during the conversion phase of the quantizer.

The techniques described herein may be implemented in a number of ways. One example environment and context is provided below with reference to the included figures and on going discussion.

Overview

Figure 1:
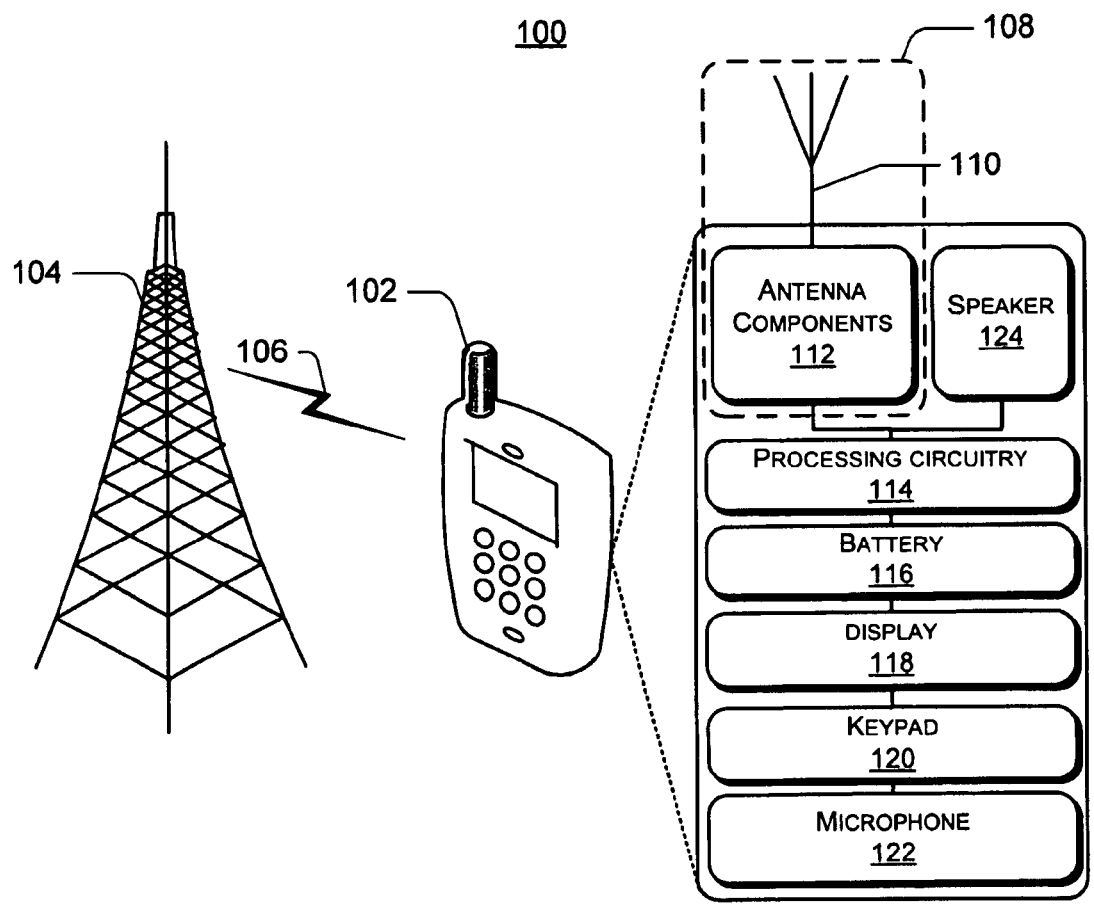
FIG. 1 shows an exemplary mobile communication system.

FIG. 1 shows a mobile communication system 100 having at least one mobile phone 102 that communicates with a base station 104 by transmitting and receiving wireless signals 106. The wireless signals 106 may be radio signals and may be digital or analog. The mobile phone 102 may have a receiver structure 108 for receiving an analog radio signal. A typical receiver structure has an antenna 110 and antenna components 112. The antenna components 112 may include an amplifier, mixer, filter, and/or an analog-to-digital converter (ADC). The receiver structure 108 is responsible for transmitting and receiving analog signals, such as analog radio signals, and converting those signals to digital signals that can be processed by processing circuitry 114, such as a microprocessor. A battery 116 provides power to mobile phone 102. Display 118, keypad 120, microphone 122, and speaker 124 are provided to allow a user to interact with the mobile phone 102.

Figure 2:
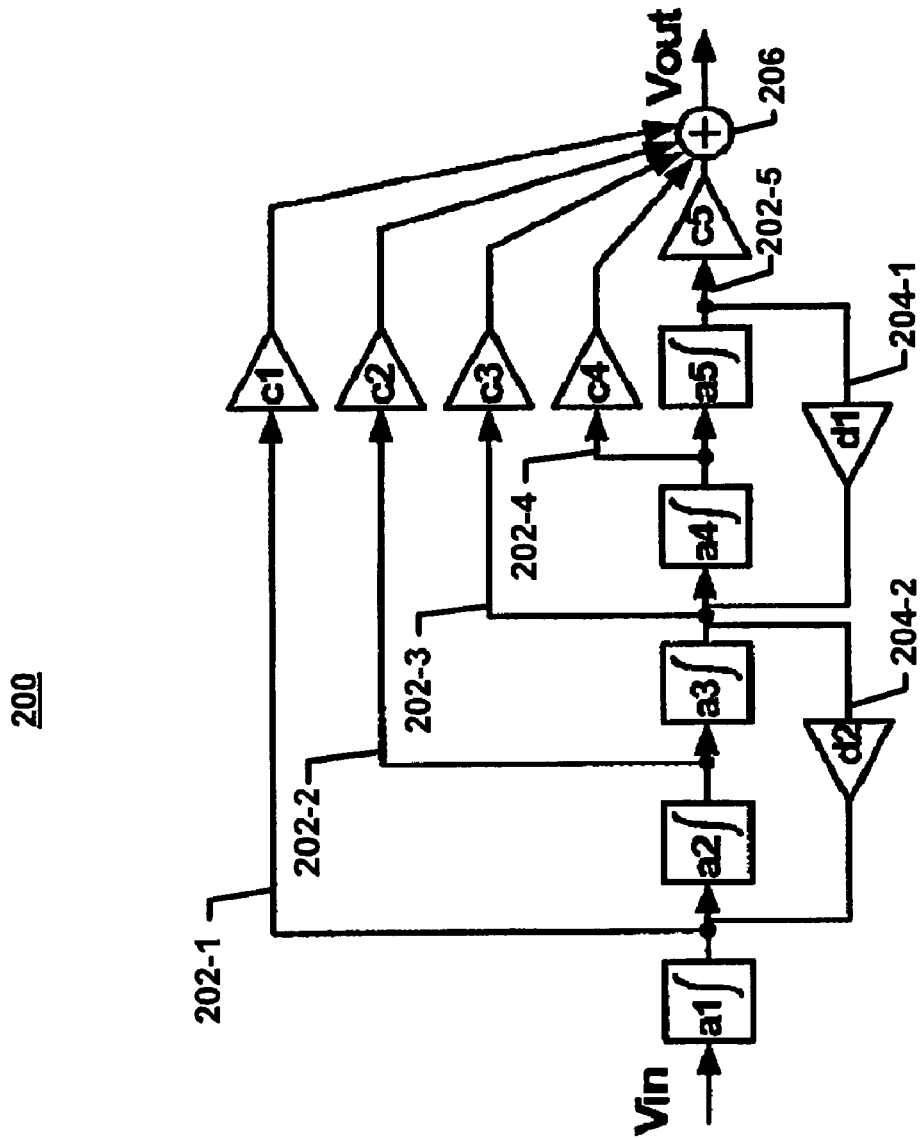
FIG. 2 shows a schematic block diagram of the general design of a conventional forward-amplifying filter circuit.

FIG. 2 shows the general design of a conventional forward-amplifying filter circuit 200. The filter 200 shown is a fifth order filter and generally comprises integrators a1-a5, and coefficients c1-c5, d1 and d2. The integrators a1-a5, d1, and d2 produce poles. The coefficients c1-c5, produce zero points. The coefficients c1 through c5 are formed by forward-amplifying branches 202-1 through 202-5. In addition, feedback paths 204-1 and 204-2 are provided with coefficients d1 and d2, respectively. To generate the coefficients, the feedback and feedforward paths may each have one or more resistors, capacitors, and/or operational amplifiers 310. A summing node 206 is placed at the output of the forward-amplifying filter circuit 200 to add the coefficients c1-c5 together and produce an output signal $V_{out}$.

Figure 3:
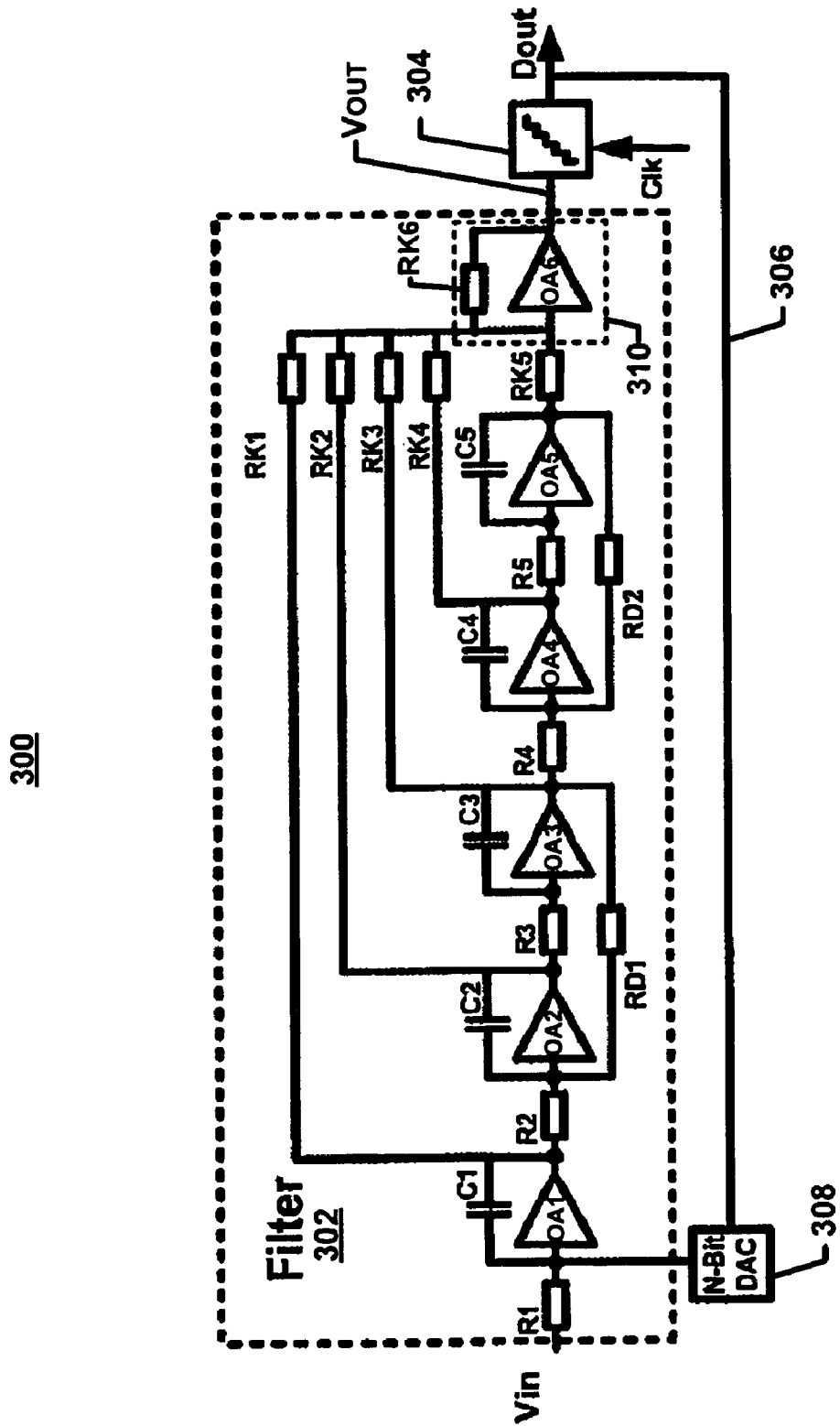
FIG. 3 shows a schematic circuit diagram of an Analog to Digital Converter (ADC) that utilizes resistors as feedforward components.

FIG. 3 shows a sigma delta Analog to Digital Converter (ADC) control loop system 300 that incorporates the filter concepts generally described with reference to FIG. 2. The control loop system 300 has a resistive coupled filter 302, a quantizer 304 and one or more feedback branches 306. The filter shown in FIG. 3 is a continuous time filter that consists of operational amplifiers OA1-OA6, resistors RK1-RK6, RD1, and RD2, and capacitors C1-C5. The operational amplifiers, resistors and capacitors may be arranged in various feedforward and/or feedback arrangements.

The quantizer 304 in system 300 performs two functions. In a first step, the quantizer 304 samples and holds the output voltage $V_{out}$ of filter 302. In a second step, the analog signal is converted to a digital signal by comparing $V_{out}$ to a reference voltage. If $V_{out}$ is smaller than the reference voltage, the digital signal may be designated as a low signal (e.g., "0" or "−1" digital signal). If $V_{out}$ is larger than the reference voltage, the digital signal may be designated as a high signal (e.g., "1"). Quantizer 304 thereby provides digital output signal $D_{out}$.

$D_{out}$ is fed to DAC 308 to be provided back to the filter 302 as part of the control loop system 300. Thus, filter 302 is typically embedded in the control loop system 300 along with the quantizer 304 and a Digital to Analog Converter (DAC) 308. This causes a phase shift in the filter 302 and a corresponding delay in the output signal $V_{out}$ from the input signal $V_{in}$. If the delay becomes sufficiently large, control loop system 300, including filter 302, DAC 308 and quantizer 304, may become unstable. Feed forward branches having resistors RK1-RK4 are inserted to stabilize the filter 304 under these conditions. An additional summing amplifier OA6 with a parallel-connected resistor RK6 is utilized with the filter 302 to produce the summing node 310 at the output of the filter circuit. The additional operational amplifier OA6 increases total power consumption of the filter 302 and increases the signal processing delay. Although the process is described as sampling and holding $V_{out}$ and the comparison stage with $V_{ref}$, it is equivalent to sample and hold $V_{ref}$ and compare, during the conversion mode, this value with $V_{out}$.

Figure 4:
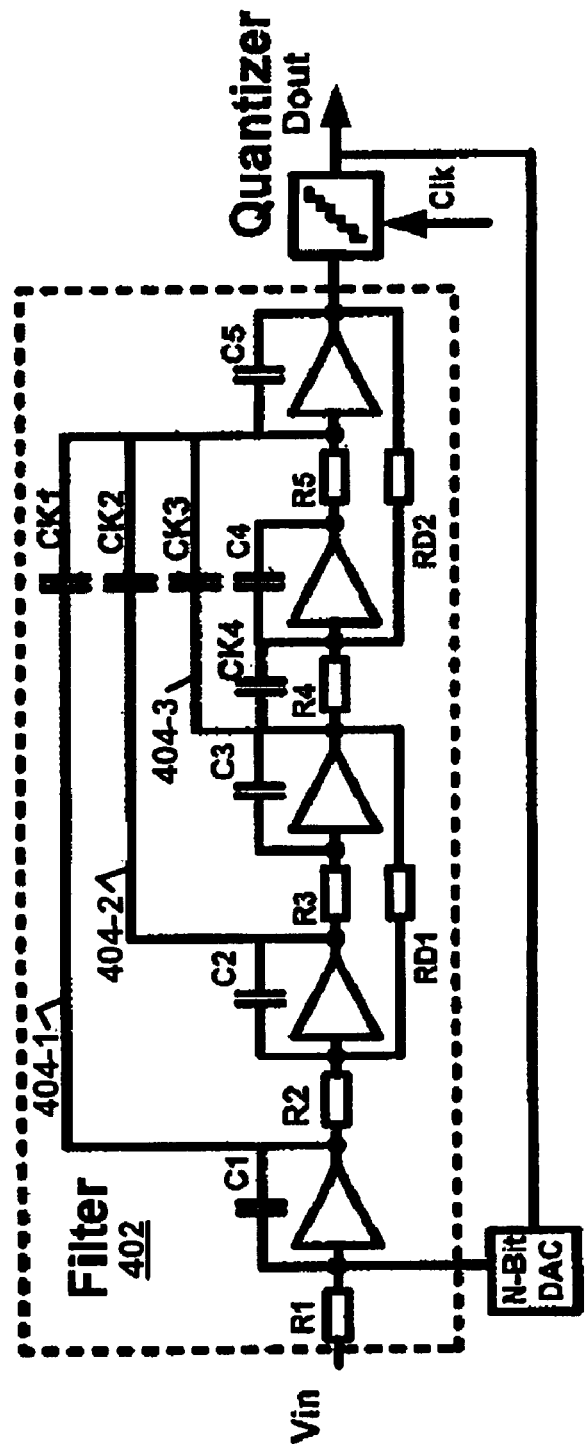
FIG. 4 shows a schematic circuit diagram of an ADC having a feed forward filter that utilizes capacitors as feedforward components.

FIG. 4 shows an alternative ADC 400 that has a feed forward filter 402 that utilizes capacitors to eliminate the need for the operational amplifier OA6 required in the configuration shown in FIG. 3. The capacitive feed forward filter 402 is similar to the resistive feed forward filter 302, except that the feedforward components for capacitive feed forward filter 402 are capacitors. The capacitive feed forward filter 402 requires fewer components than the resistive feedforward filter 302, which reduces cost size and potentially power consumption.

Exemplary Systems and Devices

Figure 5:
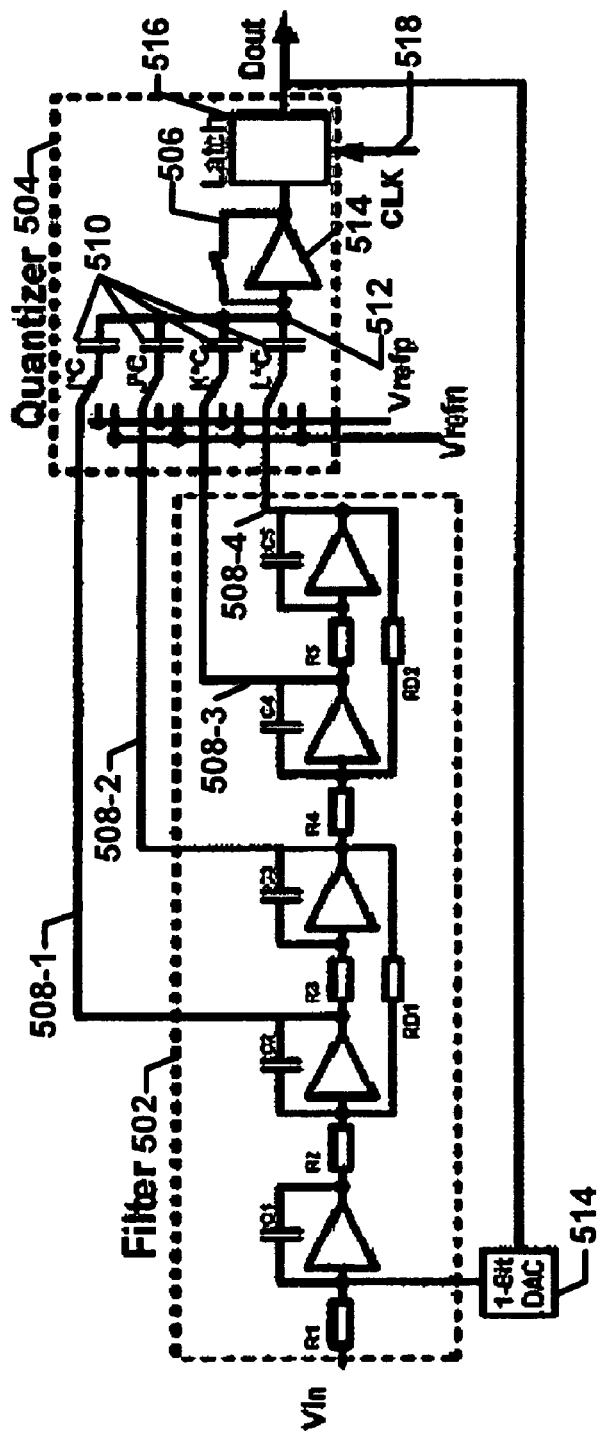
FIG. 5 shows a schematic circuit diagram of an ADC in which the capacitive elements of the feed forward filter are incorporated with a one-bit quantizer and the quantizer is operating in a summation/sampling phase.

FIG. 5 shows a system 500 with a filter 502 having capacitive forward coupling connected to a quantizer 504. Filter 502 may be a time continuous filter or a switched capacitor filter. The quantizer 504 has a switch 506 that, when closed, enables the quantizer 504 to operate in a sampling phase. The filter 502 has feedforward branches 508-1, 508-2, 508-3, and 508-4 that each provide a voltage signal to capacitive elements 510 with capacitances of I*C, J*C, K*C, and L*C, respectively. The capacitive elements 510 may consist of a single capacitor or multiple capacitors connected together and are incorporated with the quantizer 504. "I," "J," "K," and "L" represent coefficients that are pre-selected to provide desired filter characteristics. These coefficients are multiplied by the unit capacitance, "C." The coefficients may be generated using hardware to ensure that each value is weighted in accordance with its coefficient, as is conventional in the art. For example, if the desired coefficient is "1", the capacitive element is configured to have a one unit capacitance characteristic; if the coefficient is "4," the capacitive element may be configured to have a four unit capacitance characteristic, and so forth. This provides a weighting scheme for each capacitance.

The weighted capacitances create charges that are summed, sampled and held by the quantizer 504. The signals from feedforward branches 508-1, 508-2, 508-3 and 508-4 are provided to capacitive elements 510. The capacitive elements 510 are connected together to generate a potential at node 512. Closing the switch 506 makes node 512 low ohmic and acts like a ground. Although one end of the switch 506 is shown as connected to the path of the summed signal provided from the node 512, it is noted that this is shown schematically only. In practice, the output of node 512 and the feedback provided by switch 506 may be provided as separate inputs into the operational amplifier 514.

Figure 6:
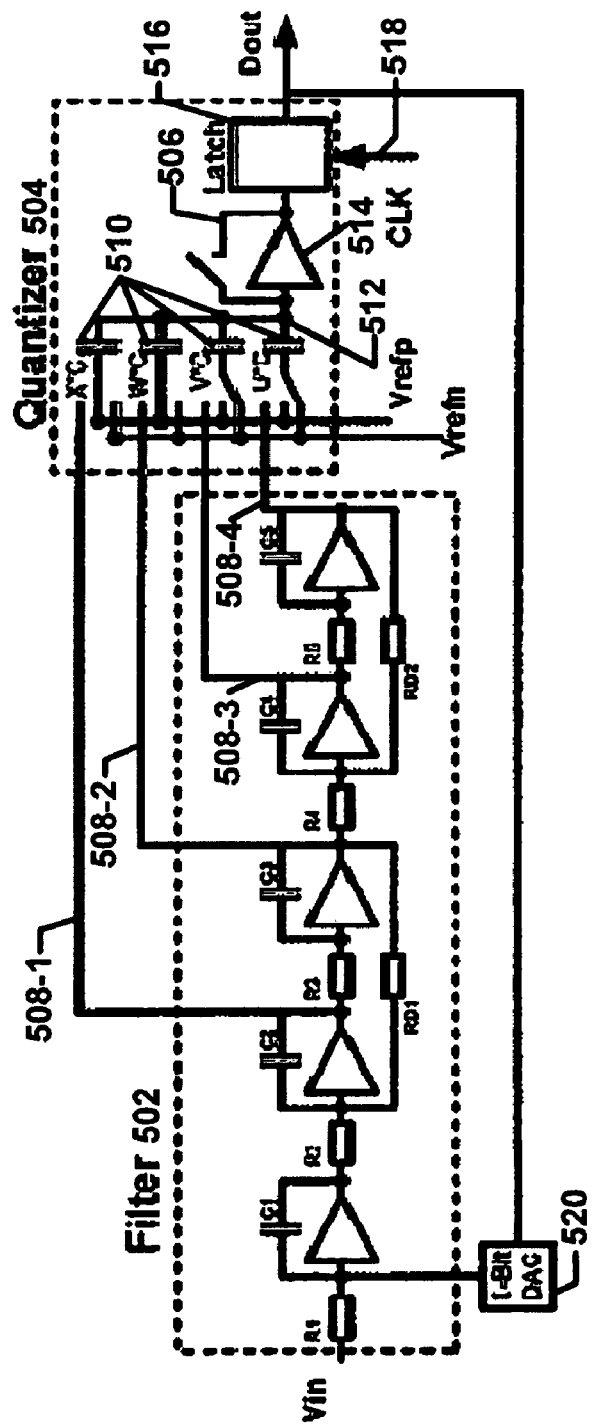
FIG. 6 shows the ADC of FIG. 5 operating in a conversion phase.

FIG. 6 shows the quantizer 504 in a conversion mode. The switch 506 is opened and high ohmic. The sampled potential or current remains at node 512. A reference voltage, either $V_{refp}$ or $V_{refn}$ is then provided to each capacitive element 510 to generate a voltage with desired characteristics. The reference voltage to be used for the conversion phase can be adjusted to optimize the conversion process.

For example, the capacitive elements 510 represented in FIG. 5 as having capacitances of I*C and J*C are connected to $V_{refp}$ and are configured to generate new capacitances represented in FIG. 6 as X*C and W*C. The capacitive elements 510 represented in FIG. 5 as K*C and L*C are connected to $V_{refn}$ and are configured to generate new capacitances V*C and U*C. The capacitances for the conversion phase (X*C, W*C, V*C, and U*C) may be selected to provide a desired reference voltage for the comparison phase ("comparison reference voltage"). Thus, if the desired comparison reference voltage is ½ Vref, the summed value of W*C and X*C is set to be equal to the summed value of V*C and U*C. This may be done by configuring the hardware to provide coefficients that will satisfy this relationship. The comparison reference voltage may then be compared against the sampled voltage.

If the sampled voltage at the capacitive element is different than the reference voltage, the voltage jumps to a higher or lower value based on the difference between the comparison reference voltage and the sampled voltage. The amplifier 506 amplifies the value relative to the reference voltage to a relatively large extent (e.g., x1,000-x1,000,000). The high voltage (i.e. voltage above the reference voltage) is amplified to the maximum value of the amplifier 502. The low voltage (i.e., voltage below the reference voltage) will be driven to the lowest value of the amplifier, e.g., ground. Thus, the output of the amplifier consists of two values based on the two states of the amplifier: saturation and ground.

During the conversion stage, the output of the amplifier 514 creates a signal at saturation (i.e., near to VDD) or ground. This signal is stored in the latch 516 as a bit. The latch 516 may contain a sample-and-hold stage so that the resulting bit(s) can be utilized and processed further. Latch 516 may be an age sensitive latch, state sensitive latch, a combination thereof, and so forth.

The implementation shown in FIG. 6 serves as only one example in which the conversion phase is performed by providing $V_{refp}$ to the capacitance elements 510 shown in the figure as having capacitances X*C and W*C and $V_{refn}$ to the capacitance elements 510 shown in the figure as having capacitances V*C and U*C. However, $V_{refn}$ and $V_{refp}$ may alternatively be connected to the capacitive elements 510 in a different configuration in order to affect the capacitance in a desired manner. For example, $V_{refn}$ could be applied to any three of the capacitive elements 510 and $V_{refp}$ could be applied to the remaining capacitive element. The configuration may be determined based on the desired design of the system 500. Moreover, multiple ADC systems 500 could be connected in parallel to generate multiple bits.

Figure 7:
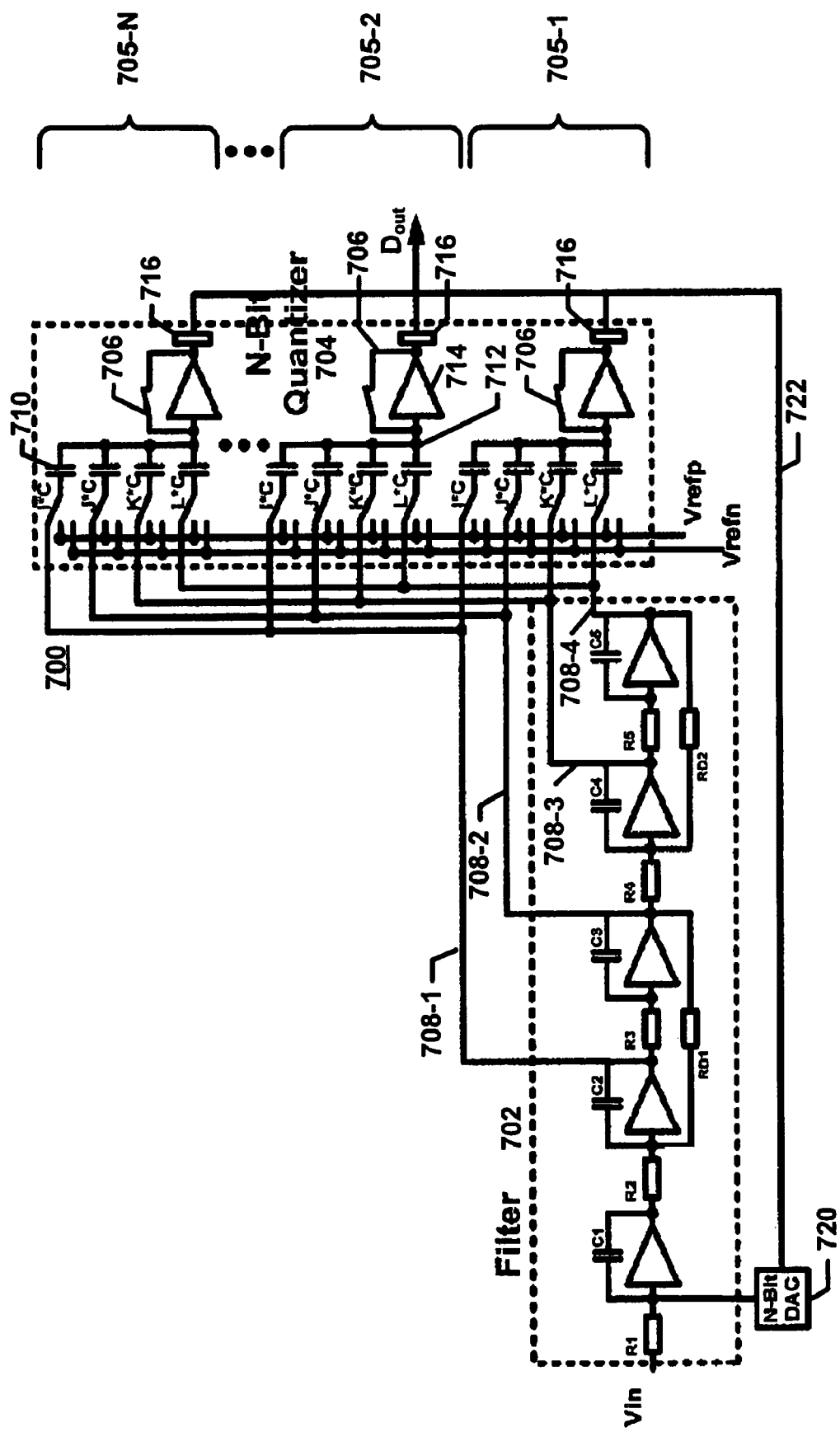
FIG. 7 shows a schematic circuit diagram of an ADC in which the capacitive elements of the feed forward filter are incorporated with a multi-bit quantizer and the quantizer is operating in a summation/sampling phase.
Figure 8:
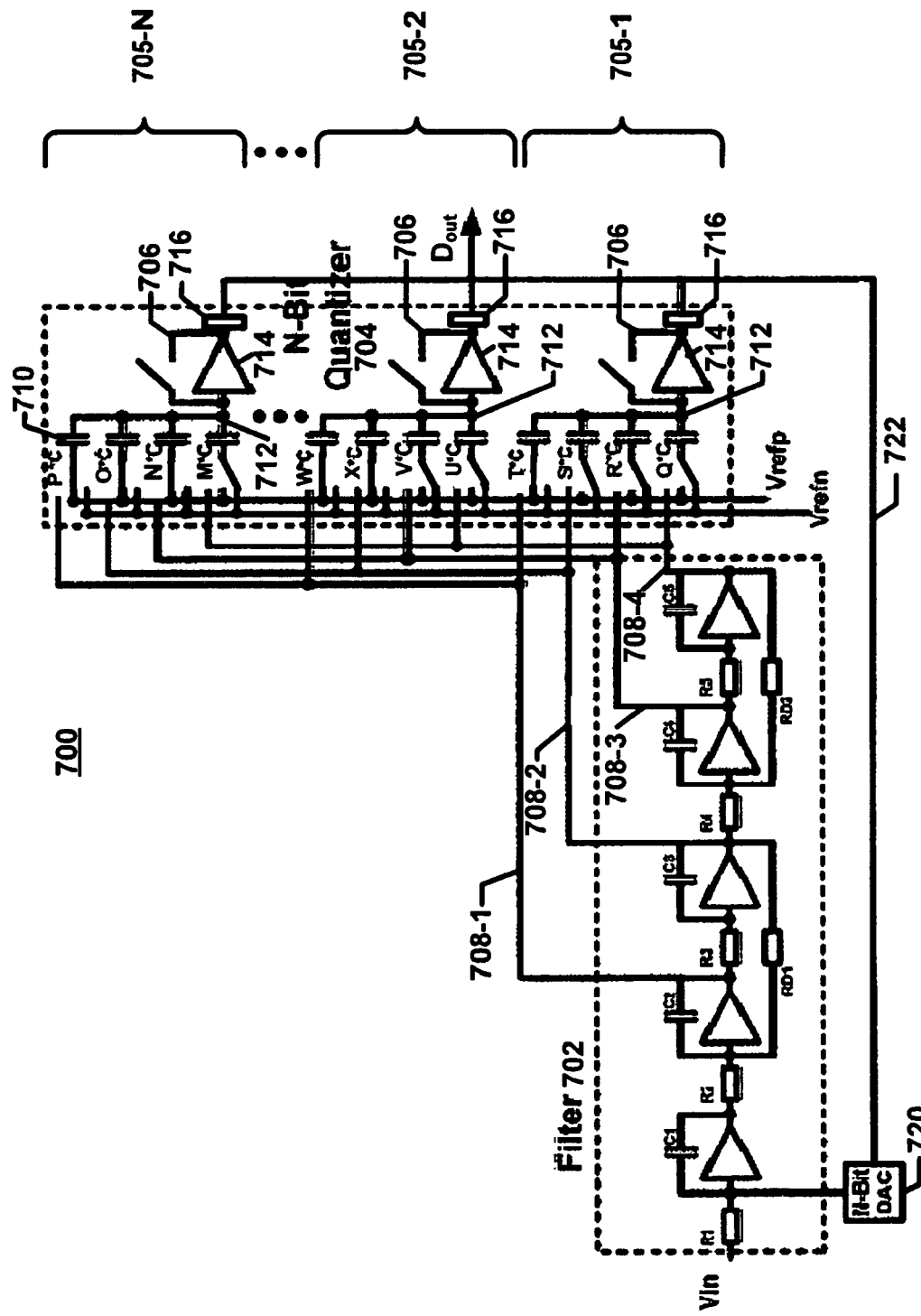
FIG. 8 shows the ADC of FIG. 6 operating in a conversion phase.

FIGS. 7 and 8 show a multi-bit, or N-bit, ADC system 700, in which a filter 702 is operable to generate multiple bits. ADC system 700 has a filter 702, which may be a time continuous filter or a switched capacitor filter, with capacitive forward coupling connected to a multi-bit quantizer 704. The multi-bit quantizer 704 includes, for example, $2^N$ sets of mechanisms for the sample and hold stage, $2^N$ amplifiers, and $2^N$ latches that, in combination, are operable to generate multiple bits. Each bit may be generated using comparator groups 705-1, 705-2, and so forth, through 705-N, where N is an integer. Each comparator group may have one or mechanisms 710 for the sample/hold stage, an amplifier 706 to amplify the difference between $V_{ref}$ and $V_{in}$ to saturation or ground, and a latch 716, in which the amplified signal (VDD or ground) is stored. Each comparator has a switch 706 that, when closed, enables that comparator (e.g., 705-1) to operate in a sample and hole stage as described above with regard to FIG. 5.

In the sample and hold stage, the switches 706 are closed. Feedforward branches 708-1, 708-2, 708-3, and 708-4 each provide a voltage signal to capacitive elements 710 in each comparator. Each comparator may be provided with the same set of capacitances (e.g., I*C, J*C, K*C, and L*C) for the sampling phase. As the coefficients and the feedforward signals are the same for given capacitive elements in each quantization group (I*C in comparator group 705-1 is identical to I*C in comparator group 705-2, and so forth), the potential at node 712 in each comparator is approximately the same.

FIG. 8 shows an example of a conversion phase of the multi-bit ADC system 700. One or more switches 706 are opened leaving a potential at each node 712 for each comparator group that has a switch 706 in an opened position. In the sampling phase, each bank (e.g. 705-1 through 705-N) of switches are connected to the filter stages with the same coefficients I, J, K, L. In the conversion phase, each comparator is provided with a different reference value (e.g., a low value of ¼ $V_{ref}$ a middle value of ½ Vref and a high value of ¾ $V_{ref}$). The reference value may be either a voltage or a current reference. These ratios of ¼, ½, and ¾ $V_{ref}$ are generated by controlling the capacitor ratios in the conversion phase. For example, certain capacitive elements 710 in comparator group 705-1 are connected to $V_{refn}$ to provide capacitances S*C, R*C and Q*C. This configuration may be designed to provide a comparison reference voltage of, for instance, ¼ $V_{ref}$. Capacitive elements 710 in comparator group 705-2 may be configured similar to the configuration of quantizer 504 described above and therefore may provide ½ $V_{ref}$. Certain capacitive elements 710 in comparator 705-N can be configured to provide ¾ $V_{ref}$ and so forth. Thus, each comparator group may be configured to act as a capacitance/voltage divider.

By modifying the capacitance configurations, and by increasing the number of comparator groups, an increased granularity is achieved. The feedforward coefficients may not necessarily be integer numbers; they are often rational numbers. To apply the appropriate coefficients to the circuitry, the number of unit capacitors may be increased. For example, instead of 4 capacitors I*C, J*C, K*C L*C, which are operable to yield coefficients of ¼, ½, ¾, and so forth, 40 capacitors can be used to obtain coefficients of 10/40, 20/40, 30/40 and so forth. Thus, increasing the number of capacitors yields better coefficient accuracy.

The comparison reference voltages for each comparator are compared to the sampled voltages at nodes 712 in a manner similar to that described above with reference to single bit quantizer 504. The sampled voltage will be either higher or lower than the comparison reference voltage. The amplifier 506 amplifies the compared value to a relatively large extent thereby generating either a high value or a low value. This value is then stored in each latch 716 associated with an amplifier 706. Latch 716 may be an age sensitive latch, state sensitive latch, a resistor, a D Flip flop structure, a master latch, a slave latch, a combination of any of these, and so forth. A clock signal may be supplied to each latch 716 to generate the digital output $D_{out}$. $D_{out}$ is shown as a single line in FIGS. 7 and 8. However, the output may be provided as N-number of wires, each wire corresponding to a separate switch 714. Likewise, feedback loop 722 is show as a single line, but may be a "bus" composed of N wires, each wire corresponding to a separate switch 714.

Exemplary Operation

Figure 9:
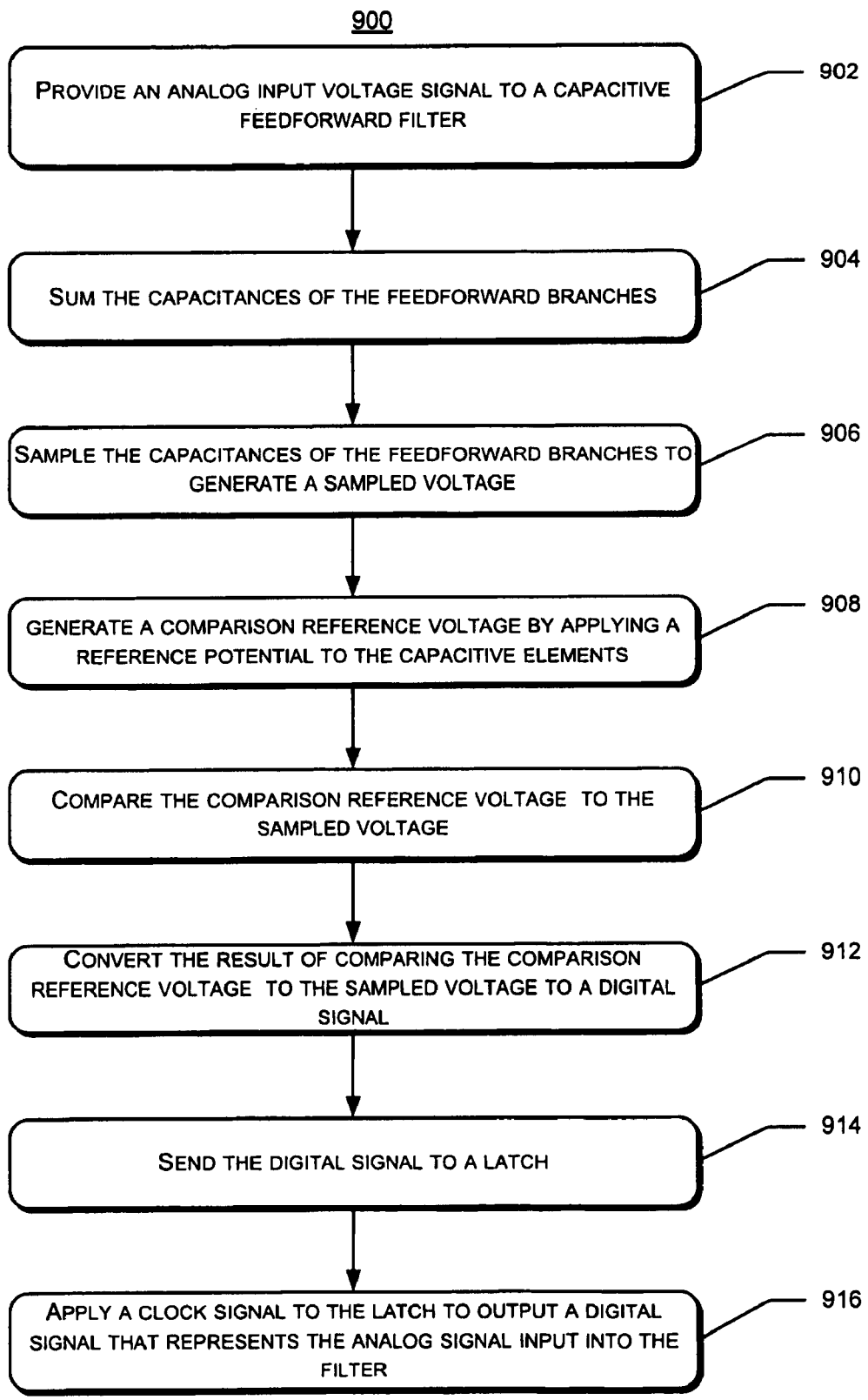
FIG. 9 shows a flow diagram of a process for converting an analog signal to a digital signal utilizing a capacitive feedforward filter in which the capacitive elements of the feedforward branches are incorporated with a quantizer.

FIG. 9 shows an exemplary process 900 for converting an analog signal to a digital signal utilizing the feedforward capacitance techniques described above. Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

At 902, an input voltage is provided to a capacitive feedforward filter. The capacitive elements of the feedforward branches may be incorporated with a quantizer.

At 904, the capacitances of the feedforward branches are summed by the quantizer.

At 906, the capacitances of the feedforward branches are sampled by the quantizer. The summation and sampling operations may be performed simultaneously. The result of the summation and sampling is a sampled voltage.

At 908, a reference potential is applied to the capacitive elements to generate a comparison reference voltage.

At 910, the comparison reference voltage is compared to the sampled voltage. The result of the comparison operation is a signal that is higher or lower than the reference voltage.

At 912, the result of the comparison operation is converted to a digital signal. The comparison and conversion operations may be performed using an operational amplifier.

At 914, the digital signal is sent to a latch. The latch may contain a sample-and-hold stage so that the resulting bit(s) can be stored, utilized, and processed further before being output by the latch.

At 916, a clock signal is applied to the latch to output a digital signal that represents the analog signal input at 902. This output may be sent to further circuitry, such as a processor for further processing according to well-known techniques in the art.

This process may be utilized with a single bit or multi-bit quantizer, such as described above with reference to FIGS. 5-8.

CONCLUSION

Although the subject matter has been described in language specific to structural features and/or methodological steps, it is to be understood that the subject matter defined in the appended claims is not necessarily limited to the specific features or acts described. Rather, the specific features and acts are disclosed as preferred forms of implementing the claims. For example, for simplicity, all schematics have been illustrated and described using single ended structures; this is not intended to exclude differential structures, to which the above description also applies.

The invention claimed is:

1. A system comprising:
   a plurality of feedforward branches;
   a quantizer having a summation mechanism operable to combine the outputs of the feedforward branches, the quantizier at least operable in a scanning phase and in a conversion phase; and
   a switch operable to cause the quantizier to be in the scanning phase or the conversion phase.

2. A system as recited in claim 1, further comprising a digital to analog converter operable to accept a signal output by the quantizer.

3. A system as recited in claim 1, wherein the feedforward branches are connected to one or more capacitive elements, the capacitive elements being in connection with the summation mechanism.

4. A system as recited in claim 1, wherein the switch when closed causes the quantizer to operate in the scanning phase and when open causes the quantizer to operate in the conversion phase.

5. A system as recited in claim 3, wherein the capacitive elements are integrated with the quantizer.

6. A system as recited in claim 5, wherein the quantizer is a multi-bit quantizer.

7. A system as recited in claim 5, further comprising a filter coupled to the plurality of feedforward branches, wherein the filter is a continuous time filter or switched capacitor filter.

8. A system as recited in claim 5, wherein the quantizer is configured to deliver a positive or negative reference to each capacitive element according to a predetermined configuration.

9. A system as recited in claim 8, wherein the reference is a voltage.

10. In a quantization environment, a device comprising:
one or more capacitors operable to receive one or more signals from one or more feedforward branches;
an amplifier operable to generate a digital signal based on the one or more signals received from the one or more feedforward branches; and
a switch connected with the amplifier and operable to place the device into a sampling phase or a digital conversion phase.

11. A device as recited in claim 10, further comprising a node between the one or more capacitors and the amplifier, the node for summing and sampling the one or more signals from the one or more capacitors.

12. A device as recited in claim 10, further comprising a latch operable to store one or more signals output by the amplifier, the latch further operable to receive a clock signal and, in response, to output the one or more signals stored in the latch.

13. A device as recited in claim 12, wherein the one or more capacitors, the amplifier, the switch, and the latch form a comparator, and wherein the device has multiple comparators connected together to output multiple bits.

14. A device as recited in claim 13, wherein each comparator is operable to compare the one or more signals received from the one or more feedforward branches to a different reference voltage.

15. A method comprising:
sampling capacitances associated with feedforward branches using a quantizer,
comparing a voltage associated with the capacitances to a reference voltage to generate a compared voltage; and
converting the compared voltage to a digital signal.

16. The method as recited in claim 15, further comprising storing the digital signal in a latch.

17. The method as recited in claim 16, further comprising providing a clock signal.

18. The method as recited in claim 15, wherein the capacitances are stored across capacitive elements incorporated with the quantizer.

19. The method as recited in claim 15, wherein the reference is a first reference voltage, the compared voltage is a first compared voltage, and converting the compared voltage to a digital signal converts the first compared voltage to first digital signal, the method further comprising comparing the voltage associated with the capacitances to a second reference voltage to generate a second compared voltage and converting the second compared voltage to a second digital signal.

20. The method as recited in claim 15, wherein the first reference voltage is generated by applying a positive reference voltage and negative reference voltage to the capacitances according to a first configuration and the second reference voltage is generated by applying a positive reference voltage and negative reference voltage to the capacitances according to a second configuration.

21. The method as recited in claim 15, wherein if the voltage associated with the capacitances is higher than the reference voltage, the compared voltage has a high value and if the voltage associated with the capacitances is lower than the reference voltage, the compared voltage has a low value.

22. The method as recited in claim 15, wherein the compared voltage is converted to a digital signal by amplifying the high compared voltage value to a maximum handling capability of an amplifier, the maximum handling capability of the amplifier representing a digital value of 1, or by amplifying the low compared voltage to a ground potential, the ground potential representing a digital value of 0.

* * * * *